US007523020B2

(12) United States Patent
Tice

(10) Patent No.: US 7,523,020 B2
(45) Date of Patent: *Apr. 21, 2009

(54) APPARATUS AND METHOD FOR DYNAMIC SMOOTHING

(75) Inventor: Lee D. Tice, Bartlett, IL (US)

(73) Assignee: Honeywell International Inc., Morristown, NJ (US)

(*) Notice: Subject to any disclaimer, the term of this patent is extended or adjusted under 35 U.S.C. 154(b) by 25 days.

This patent is subject to a terminal disclaimer.

(21) Appl. No.: 11/389,725

(22) Filed: Mar. 27, 2006

(65) Prior Publication Data

US 2006/0167640 A1 Jul. 27, 2006

Related U.S. Application Data

(62) Division of application No. 10/619,827, filed on Jul. 15, 2003, now Pat. No. 7,076,403.

(51) Int. Cl.
*H03F 1/26* (2006.01)

(52) U.S. Cl. .................................................... 702/191

(58) Field of Classification Search .................. 702/57, 702/64, 66, 67, 68, 74, 79, 104, 111, 116, 702/124, 182, 183, 189, 190, 191, 193, 83; 341/61; 348/518; 704/214, 193
See application file for complete search history.

(56) References Cited

U.S. PATENT DOCUMENTS 4,222,074 A * 9/1980 Breithaupt .................. 348/518
5,729,225 A * 3/1998 Ledzius ........................ 341/61
5,831,524 A 11/1998 Tice et al. ................... 340/506
6,222,456 B1 * 4/2001 Tice ........................... 340/630
6,229,439 B1 5/2001 Tice ........................... 340/506
6,240,381 B1 * 5/2001 Newson ....................... 704/214
6,865,940 B2 3/2005 Poole ...................... 73/335.05
7,076,403 B2 * 7/2006 Tice ........................... 702/191
2004/0133350 A1 * 7/2004 Veneruso et al. ............... 702/6

* cited by examiner

*Primary Examiner*—Edward Raymond
*Assistant Examiner*—Mohamed Charioui
(74) *Attorney, Agent, or Firm*—Husch Blackwell Sanders Welsh & Katz

(57) ABSTRACT

An apparatus and a method for receiving and processing noisy communications signals automatically varies multiple processing parameters to both improve signal-to-noise ratio and to minimize delays in responding to changes in the incoming signal. The signal-to-noise ratio is improved with relatively stable signals by increasing the number of samples used in forming a processed signal value. In response to changes in signal input, the number of samples used in processing is substantially decreased while the sampling rate is substantially increased until the incoming signal exhibits an increased degree of stability. As the incoming signal becomes more stable, the number of samples used in performing a processed signal value is increased toward maximum and the sample rate is decreased. In an apparatus, noisy signals from an ambient condition sensor can be processed in control circuitry, which incorporates executable instructions, for carrying out signal processing with automatic multi-parameter variations in response to incoming signal characteristics. Processed signal values can be displayed locally or made available to a larger system.

14 Claims, 5 Drawing Sheets

APPARATUS AND METHOD FOR DYNAMIC SMOOTHING

CROSS REFERENCE TO RELATED APPLICATION

This application is a Divisional of and claims the benefit of the filing date of U.S. patent application Ser. No. 10/619,827 filed Jul. 15, 2003 and entitled "Apparatus and Method for Dynamic Smoothing".

FIELD OF THE INVENTION

The invention pertains to processing of noisy signals as might be present as outputs of condition sensors. Sensor output signals are processed so as to improve response times and to reduce the effects of noise. More particularly, the invention pertains to an apparatus and a method for varying processing characteristics to improve performance of the detector.

BACKGROUND OF THE INVENTION

It has been recognized that there is an advantage to suppressing the effects of noise present on sensor outputs so as to minimize, for example, false positives. In this regard, it has been known that if a signal with noise, a raw signal, is averaged over a large number of samples, for example 128 samples, it will have less resulting noise than if averaged over a smaller number, such as four samples. The disadvantage of using the larger number of samples is that delay is introduced into the processed signal which becomes very slow in responding to changes in the raw signal.

One approach has been disclosed and described in Tice et al U.S. Pat. No. 5,831,524 entitled System and Method For Dynamic Adjustment Of Filtering In An Alarm System. While useful for their intended purpose, such systems do tend to introduce a degree of delay in the processed signals. It would be preferable if such response delays could be further minimized.

DETAILED DESCRIPTION OF THE EMBODIMENTS

Figure 1:
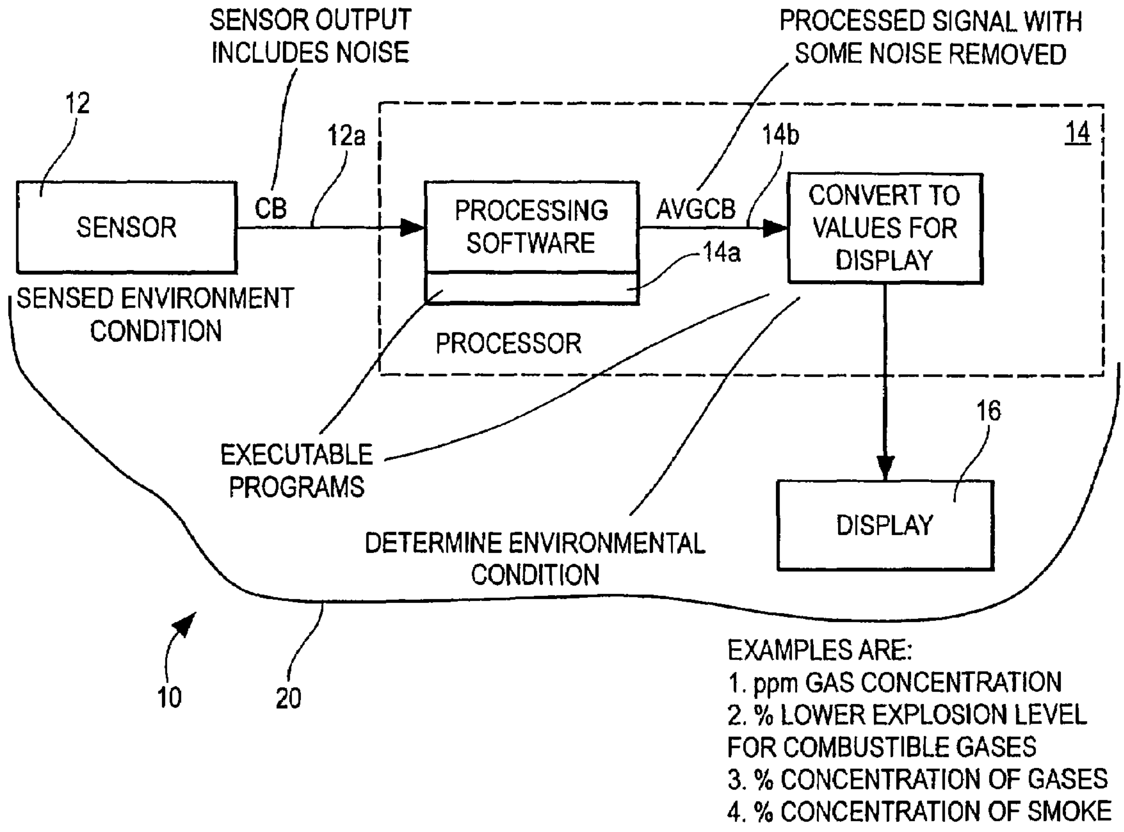
FIG. 1 is a block diagram of an exemplary detector in accordance with the present invention.

While embodiments of this invention can take many different forms, specific embodiments thereof are shown in the drawings and will be described herein in detail with the understanding that the present disclosure is to be considered as an exemplification of the principles of the invention and is not intended to limit the invention to the specific embodiment illustrated.

Detectors and methods in accordance with the present invention exhibit a fast response to signal changes, for example produced by changing ambient conditions along with an improved signal-to-noise ratio. Communications signals as well as signals from sensors can be processed accordingly.

The method incorporates variable averaging which is used to remove the noise. A variable averaging equation varies and dynamically changes the number of samples in response to incoming signals. For example, the number of samples used for forming an average, hence suppressing or removing noise, can vary from one to k where k can be, for example, equal to 128 or higher.

The processing method can carry out signal averaging using fewer samples where the incoming signals are varying. A larger number of samples, hence a higher degree of averaging, can be used for signals that are not varying appreciably.

The lesser number of samples results in a shorter response time such that the processed signal will follow the changes in the incoming signal. At the same time, the sample rate can be substantially increased thereby improving response time during transition intervals. The number of samples can again be increased if the incoming signal stabilizes. The trade-off is that more noise will be present than during those time intervals where the incoming signals from the sensor are not varying as much. In that circumstance, a larger number of samples can be used which produces a greater degree of averaging, and an improved signal-to-noise ratio.

In a disclosed embodiment, an exponential averaging equation is used. For example:

$$AVGSIG=(PrevAVGSIG*(K-1)+CURR\ SIG.)/K.$$

The following are relevant for the above equation:

K=number of samples;

AVGSIG=the present averaged signal value;

PREVAVSIG=the prior averaged signal value.

In the above equation, each new sampled signal value contributes 1/K to the current averaged signal value.

This signal processing can be used to process outputs from gas, smoke, beam, fire, heat, and humidity type sensors or detectors. It can also be used to remove noise from communication signals of all types.

The method of implementing a dynamic averaging coefficient that changes with time can include the use of a short term averaging method or equation and a long term averaging method or equation. At least one dynamic averaging coefficient must be used in at least one averaging equation.

An example of short term averaging methods that can be used to remove the peaks of noise, especially the peaks that extend beyond 2 sigma from the mean are minimum and maximum routines. An example of a minimum routine is where the processing selects the smallest of three running consecutive values if the noise is greater than the long term averaged value. Similarly, a corresponding maximum routine can be used where the noise is less than the long term averaged value.

If the noise is a normal distribution, then the probability of noise occurring above +2 sigma is only 0.0228 for a single sample. The probability of noise being above, 2 sigma for three consecutive samples is 0.0000118 or around 1900 times less likely. The minimum of three averaging routine will help remove noise. A long term averaging routine is still needed to obtain the absolute accuracy of the signal; and provides a reference for the minimum of three averaging routine.

Instead of the minimum routine, another example of a short term averaging equation is an average of 8-10 running samples. When this short term average is between levels based upon the noise and deviates significantly from the long term averaging equation, then the averaging coefficient in the long term averaging equation can be reduced. During this time, the long term averaging equation S/N ratio decreases significantly, perhaps as low as K=1. However, the long term averaging equation now responds faster to come up to the short term averaging equation level. After the short term averaging equation level is reached, the averaging coefficient can be increased to again establish a high signal-to-noise ratio for accurate measurement.

This dynamic type operation provides a fast adjustment to new levels of the signal. Further, a high degree of noise suppression can be achieved for obtaining an accurate signal measurement with a high signal-to-noise ratio.

Other long term averaging equations and short term averaging equations can be used without departing from the spirit and scope of the invention. As noted above, the source of the raw signal to be processed is not a limitation of the invention.

FIG. 1 is a block diagram of a detector 10 which embodies the present invention. The detector 10 includes at least one sensor 12 which responds to a selected ambient condition. The sensor 12 could, for example, be at least one of a gas sensor, a smoke sensor, a radiant energy or beam sensor, a fire sensor, a heat sensor, or a humidity sensor. Raw output CB from sensor 12, via, for example, line 12*a*, can be coupled to control circuits which could be implemented in part with a processor 14.

Processor 14 has associated therewith one or more executable programs 14*a* which can process the signals CB, line 12*a*, in accordance with the present invention. Processed signals, for example, indicated symbolically on line 14*b* can in turn be converted to displayable values. These values can be displayed at a local display 16. The displayed values can be indicative of parts per million of gas concentration, percent of concentration of gases, smoke or the like or a percent of an expected lower explosion level for combustible gases.

It will be understood that the detector 10 could be carried in a housing 20 and could be a self-contained device. Alternately, the detector 10 can be part of a larger alarm system.

Figure 2A:
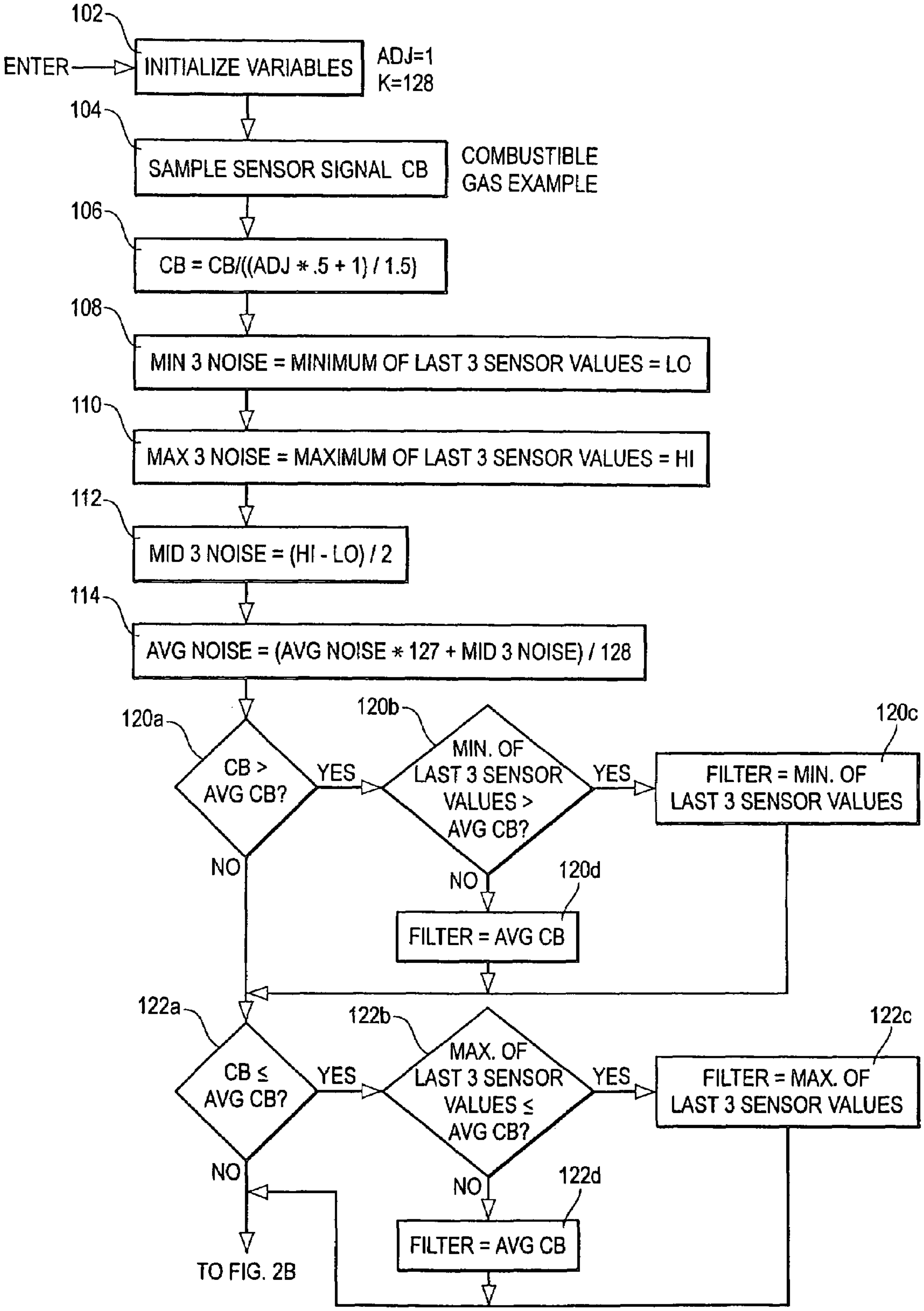
FIGS. 2A, B and C are a flow diagram of signal processing in accordance with the present invention.
Figure 2B:
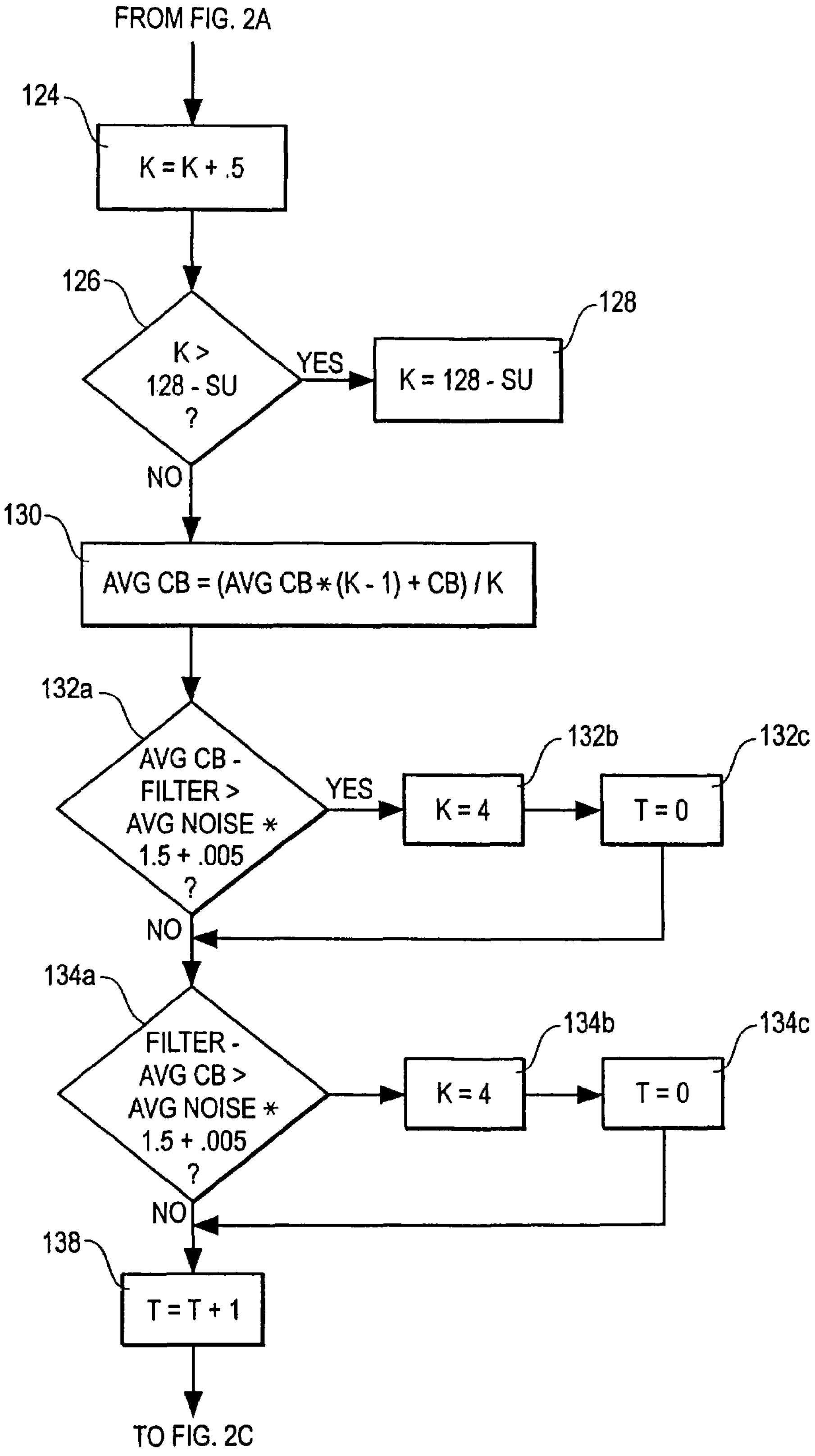
Figure 2C:
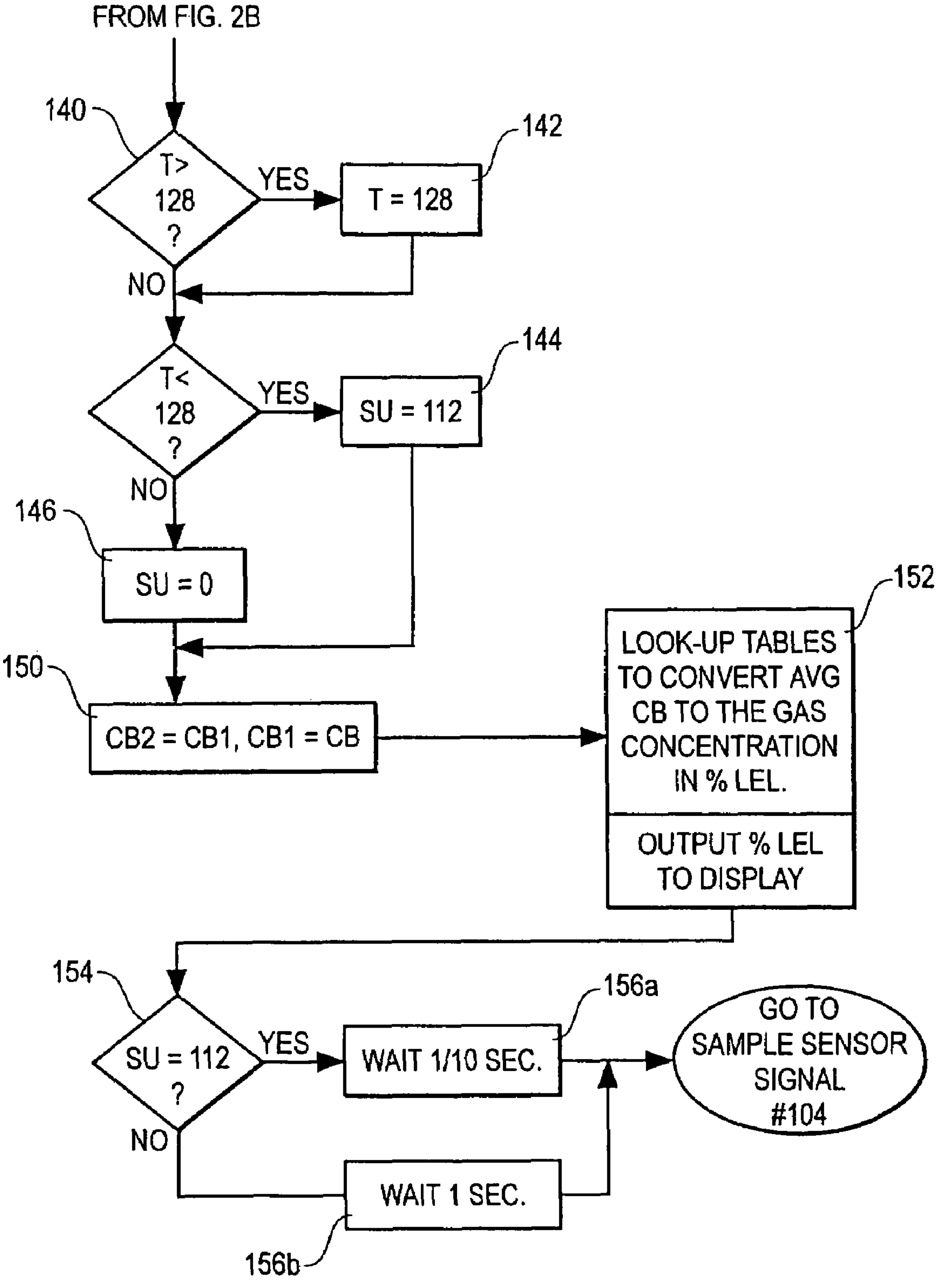

FIGS. 2A, B and C illustrate steps of an exemplary processing method 100 in accordance with the invention. In an initial step 102, variables can be initialized. For example, the following variables can be initialized:

ADJ=1; and K=128 (K is indicative of the number of samples).

In a step 104, a raw signal value CB on line 12*a* is sampled. In a step 106, an adjusted signal value CB is formed dependent on the value of the parameter ADJ. In a step 108, MIN 3 noise processing is carried out to select the minimum of the last three sensor values CB. The minimum is set equal to LO.

In a step 110, MAX3 noise processing is carried out to select the maximum of the last three signal values CB. The maximum is established and set equal to HI.

In a step 112, the LO value, step 108 and the HI value, step 110, are averaged. In a step 114, AVG noise is determined. This value is used to set threshold or trip levels as discussed subsequently, steps 132*a*, 134*a*.

In steps 120*a, b, c* and *d* and 122*a, b, c* and *d*, the adjusted CB value, step 106, is compared to the current AVG CB value in a process which tends to reduce noise induced variations relative to the AVG CB value.

In steps 120*a . . . d*, the adjusted sample value CB is compared to the average sample value AVG CB and if greater, then a "FILTER" parameter value is established, step 120*c* or *d*. Similarly, in steps 122*a, b, c,* and *d*, the adjusted signal value CB is compared to the average signal value AVG CB and if less than or equal to same, a value of the parameter "FILTER" is set in step 122*c* or *d*.

In step 124, the value of K is increased.

In step 126, the number of samples is compared to a speed-up or, reduced, number of samples. In the event that K exceeds same, the value of K is clamped to a reduced number of samples, step 128. This produces a speed-up condition, where fewer samples are used for the averaging process. As a result, the processed sampled signal values AVG CB track the changing signal values CB, step 104, with minimal delay.

In step 130, an updated AVG CB value is established based on the number of samples, and the value of K. In steps 132*a, b, c* and 134*a, b, c*, a comparison is made, and acted on to pick up significant variations of signal CB from the AVG CB value.

Steps 132*a, b* and *c* are responsive to an increasing CB value. In step 132*a*, a threshold is increased in the presence of more noise. In response thereto, the number of samples is reduced immediately to a relatively low value such as K=4, step 132*b*. The value of a time-out parameter T is initialized in step 132*c*. The time-out parameter T establishes the duration of higher sample rate.

Similarly, steps 134*a, b, c,* are responsive to a decreasing CB value. In the step 134*a*, a threshold is decreased in the presence of less noise. During time interval T the processing is also speeded up by using a reduced number of samples, steps 132*b*, 134*b*.

In step 138, the time parameter T is increased. In step 140, the time parameter T is compared to a predetermined maximum. If the time parameter T exceeds the maximum, it is clamped to that value in a step 142. In the event that it does not exceed that value, the speed-up parameter SU is set to a value which reduces the number of samples, step 144.

At the end of the speed-up interval, step 146, the speed-up parameter SU is set equal to zero. This enables the number of samples to increase. In a step 150, the two most recent values CB1 and CB2 are up-dated.

The AVG CB value can be converted to a displayable indicium in a step 152. In a step 154, the value of the speed-up parameter SU is evaluated to establish the time interval to the next sample, steps 156*a, b*. Hence, as the incoming signals exhibit variations, the number of samples is decreased and the sample rate is increased. Conversely, when the incoming signals stabilize, the number of samples increases and the sample rate is decreased.

The processing methodology 100 is illustrated in connection with the graphs of FIG. 3. Graph 200 corresponds to instantaneous raw signal values CB from any source, such as from sensor 12, line 12*a*. In a region between 15 and approximately 180 seconds, the values of the signal 200, CB are substantially stable although overlaid with noise. During this interval, the value of K, graph 202, the number of samples, remains substantially constant at 128, see step 128.

Graph 206 corresponds to the processed value AVG CB, see step 130. In the region between 15 to approximately 180 seconds, this value is substantially constant with random-type noise suppressed.

Where at approximately 180 seconds, the value 200 of the signal CB drops precipitously 202-1 due to a change in the sensed environmental condition, the value of the number of samples K, see 204, drops immediately, indicated at 204, to K=4, step 134*b*, at 204*a*. For the next several seconds, region 204*b*, the sample rate is increased, step 156*a* while at the same time, the value of K is permitted to increase from a value of four samples to a value of 16 samples.

The value of K is clamped to 16 samples, for example, during the remainder of the speed-up interval 204*c* which lasts until approximately 215 seconds. At this time, 204*d*, the sample interval reverts to one second, step 156*b* and the value of K is permitted to increase back toward 128, step 128.

Figure 3:
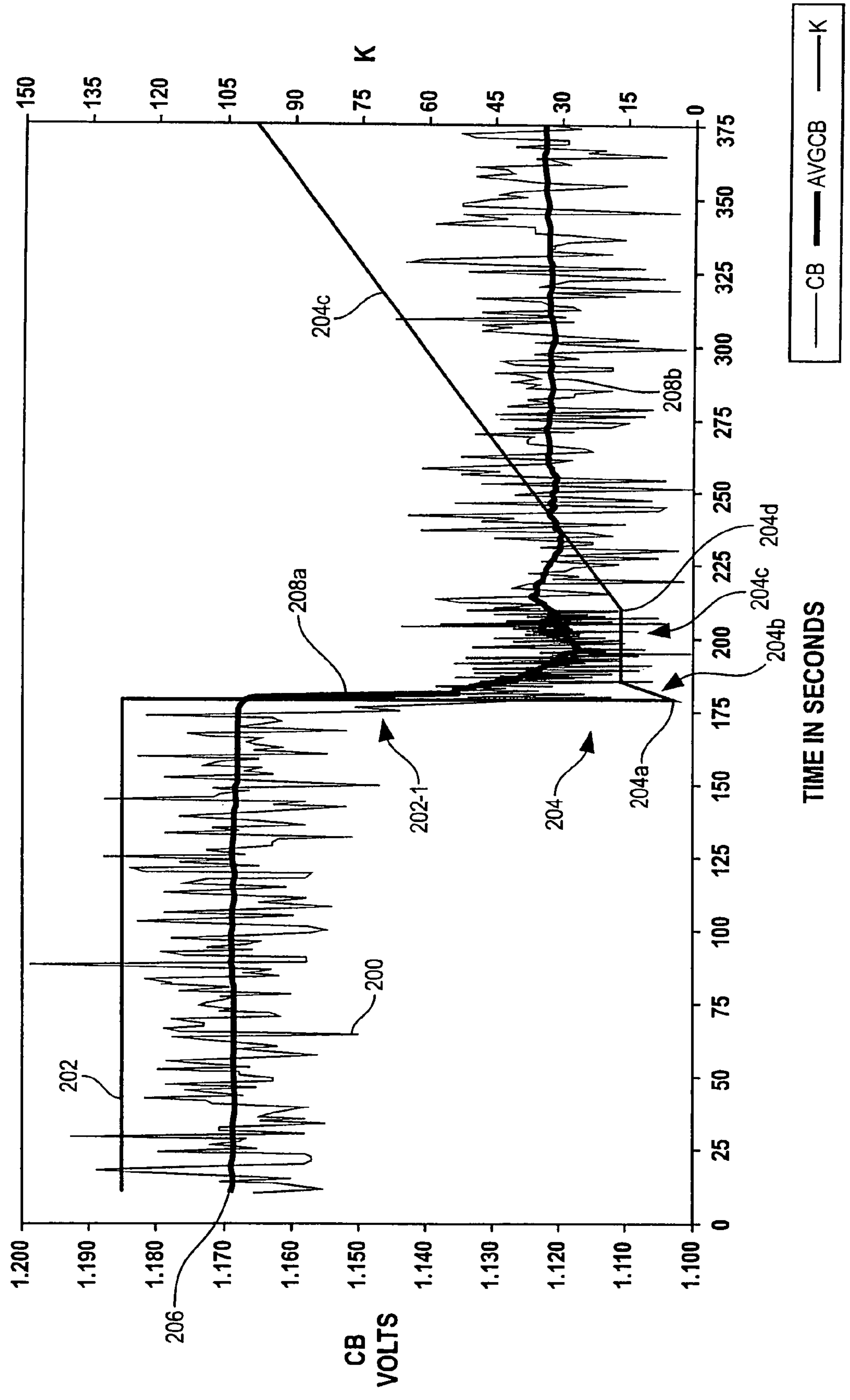
FIG. 3 is a graph illustrating characteristics of signals processed in accordance with the present invention.

During the speed-up interval, as illustrated in FIG. 3, the averaged signal value AVG CB 208*a* tracks the declining raw signal value CB closely thereby minimizing smoothing delays due to fewer numbers of samples and a higher sample rate. At the end of the speed-up interval 204*d*, approximately 215 seconds, the value of AVG CB again corresponds to the raw signal output value 200 in the absence of noise. The AVG CB value 208*b* continues to experience increasing degrees of averaging in that the value of K is continually increasing, 204*e,* subsequent to the end of the speed-up interval 204*d* at approximately 215 seconds.

It will be understood that the source of the raw input signal is not a limitation of the invention. Also, the illustrated methodology 100 could be varied without departing from the spirit and scope of the invention. For example, neither specific sample rates nor numbers of samples are limitations of the invention.

As those of skill in the art will understand, the time-out interval, set by parameter T, step 132*c,* can be implemented using a hardwired timer circuit. Alternately, the time-out interval can be implemented with executable instructions, such as 14*a,* in combination with processor 14.

From the foregoing, it will be observed that numerous variations and modifications may be effected without departing from the spirit and scope of the invention. It is to be understood that no limitation with respect to the specific apparatus illustrated herein is intended or should be inferred. It is, of course, intended to cover by the appended claims all such modifications as fall within the scope of the claims.

What is claimed:

1. A signal processing method for removing noise from a signal comprising:
- establishing at least first and second sample rates with the second sample rate higher than the first;
- establishing at least first and second degrees of smoothing with the second degree less than the first degree;
- sampling a signal at the first rate;
- smoothing the sampled signal with the first degree of smoothing;
- evaluating a first smoothed, sampled signal value, and
- where the first value crosses a threshold value, altering both the sample rate and the degree of smoothing for a predetermined time interval.

2. A method as in claim 1 where at least during the predetermined time interval, the degree of smoothing is increased.

3. A method as in claim 2 where the degree of smoothing is increased linearly.

4. A method as in claim 2 where the degree of smoothing is increased by increasing a number of sampled signal values incorporated into the smoothing process.

5. A method as in claim 2 where the second degree of smoothing is maintained for a selected time interval before the degree of smoothing is increased.

6. A method as in claim 1 which includes sensing an ambient condition and producing a noisy signal indicative thereof.

7. A method as in claim 6 which includes determining a minimum value of a predetermined number of samples.

8. A method as in claim 6 which includes determining a maximum value of a predetermined number of samples.

9. A method as in claim 1 where the threshold value varies in response to noise on the signal.

10. A computer readable medium encoded with software for enabling a computer to remove noise from a signal comprising:
- instructions for sampling a noisy signal;
- instructions for establishing an average noise parameter for the signal;
- instructions for updating a parameter indicative of a number of signal samples to be used in an averaging process;
- instructions for forming an averaged signal value;
- instructions for comparing the averaged signal value to a representation of the average noise parameter, and responsive thereto, including further instructions for altering a sample rate parameter and for altering the number of signal samples used in the averaging process.

11. The computer readable medium as in claim 10 which includes:
- additional instructions for continuously varying the number of signal samples.

12. The computer readable medium as in claim 10 which includes:
- additional instructions for establishing a range over which the number of signal samples is altered.

13. The computer readable medium as in claim 10 which includes:
- additional instructions for establishing a time interval during which the number of signal samples is varied.

14. A method comprising:
- sampling a noisy signal;
- establishing an average noise parameter for the signal;
- updating a parameter indicative of a number of signal samples to be used in an averaging process;
- forming an averaged signal value;
- comparing the averaged signal value to a representation of the average noise parameter, and responsive thereto, altering a sample rate parameter and altering the number of signal samples used in the averaging process.

* * * * *